United States Patent [19]

Filliman

[11] Patent Number: 5,255,220
[45] Date of Patent: Oct. 19, 1993

[54] DUAL PORT VIDEO MEMORY SYSTEM HAVING PULSE TRIGGERED DUAL COLUMN ADDRESSING

[75] Inventor: Paul D. Filliman, Indianapolis, Ind.

[73] Assignee: Thomson Consumer Electronics, Inc., Indianapolis, Ind.

[21] Appl. No.: 876,076

[22] Filed: Apr. 28, 1992

[30] Foreign Application Priority Data

Apr. 16, 1992 [GB] United Kingdom ............... 9208493

[51] Int. Cl.⁵ .............................................. G11C 7/00
[52] U.S. Cl. ........................... 365/189.04; 365/220; 365/230.05; 365/239; 365/240
[58] Field of Search ............ 365/189.04, 230.05, 365/220, 221, 230.09, 239, 240, 238, 231, 240

[56] References Cited

U.S. PATENT DOCUMENTS

| | | | |
|---|---|---|---|
| 3,763,480 | 10/1973 | Weimer | 340/173 |
| 4,321,695 | 3/1982 | Redwine et al. | 365/240 |
| 4,541,076 | 9/1985 | Bowers et al. | 365/190 |
| 4,821,226 | 4/1989 | Christopher et al. | 364/900 |
| 4,945,518 | 7/1990 | Muramatsu et al. | 365/221 |

FOREIGN PATENT DOCUMENTS

| | | | |
|---|---|---|---|
| 0204591 | 8/1988 | Japan | 365/189.04 |
| 9107754 | 5/1991 | PCT Int'l Appl. | 365/189.04 |

OTHER PUBLICATIONS

Motorola Memories, Series E, Second Printing, 1988, Motorola Semiconductor Technical Data, MCM68HC34, pp. 5—3-5—10.

Primary Examiner—Eugene R. LaRoche
Assistant Examiner—Son Dinh
Attorney, Agent, or Firm—Joseph S. Tripoli; Peter M. Emanuel; Richard G. Coalter

[57] ABSTRACT

Read column conductors and write column conductors of a memory array are addressed by respective triggerable sequential pulse generators which, upon receiving respective trigger pulses, provide respective read and write address pulses to respective column conductors of the array. Data to be stored is written in parallel to cells of the memory a column at a time at a rate determined by the write sequential pulse generator and is recovered a column at a time at a rate determined by the read sequential pulse generator. Advantageously, (1) the ratio of the read and write rates may be selected to provide time compression, time expansion or constant delay of video data; (2) additionally data may be written and read concurrently without bus contention and (3) addressing is simplified by a timed application of trigger pulses to the pulse generators whereby there is no need for application to the memory of binary addressing data.

4 Claims, 4 Drawing Sheets

DUAL PORT VIDEO MEMORY SYSTEM HAVING PULSE TRIGGERED DUAL COLUMN ADDRESSING

FIELD OF THE INVENTION

This invention relates to memories and particularly to dual port video memories.

BACKGROUND OF THE INVENTION

Various forms of memories have been proposed for providing video processing functions. As explained below, the known memories vary substantially in complexity depending upon the specific application in which they are used.

At one end of the range of complexity there are simple shift registers, charge-coupled devices and glass delay lines for providing a fixed amount of delay. Such devices are useful, for example, in line comb filtering applications for the separation of luminance and chrominance signals. They are also useful, as another example, in progressive scan processing systems for providing vertical interpolation or "line averaging" to generate extra lines of video for display. Also, in progressive scan applications, a one-line shift register may be "read" or "clocked" at twice its input rate to thereby provide the function of time compression of video lines. Such devices, however, have limited addressing capabilities.

In applications where substantial delay may be desired, one may combine a number of serial and parallel shift registers as described, for example, by P. K. Weimer in U.S. Pat. No. 3,763,480 entitled DIGITAL AND ANALOG DATA HANDLING DEVICES which issued Oct. 2, 1973. In an embodiment of the Weimer memory, serial input signals are converted to parallel form by a serial-in parallel-out (SIPO) shift register. Once in parallel form, the data is successively delayed by a plurality of parallel registers and the output of the last parallel register is coupled to a parallel-in serial-out (PISO) shift register for conversion of the data back to serial form. This structure, however, is not adapted for applications requiring concurrent reading and writing at difference clock rates.

Dual port video memories are known which feature full addressing capabilities in which any pixel (picture element) in any location can be written (stored) or read (recovered). In a conventional video RAM of this type, the operations or reading and writing can take place concurrently. Such devices are particularly useful in video graphics processing in computers and in "picture in picture" processing in television receivers. An example of a dual ported video RAM is the type MCM68HC34 device manufactured by Motorola and described, for example, at pages 3-10 in chapter 5 of the Motorola data book "Memories" that was published (second printing) in 1988. A problem with such devices, however, is that the read/write addressing requires many address lines and complex decoders to address cells in the random access memory (RAM) and addresses must be supplied in binary form requiring a number of write address bit inputs and a number of read address bit inputs.

The addressing problem can be reduced, to a certain extent, by transmitting the binary address data serially to the memory as described, for example, in U.S. Pat. No. 4,821,226 of Christopher et al. entitled DUAL PORT VIDEO MEMORY SYSTEM HAVING A BIT-SERIAL ADDRESS INPUT PORT which issued Apr. 11, 1989. In an embodiment of the Christopher et al. memory system, read and write address data and a control signal are serially loaded into a shift register. Address sequencing circuitry transfers the read and write address values to integral read and write address registers and, based on the control value and initiates respective read and/or write operations. Although addressing is some-what simplified in such systems, the addressing is still essentially in binary code and relatively complex address decoders and storage registers are required.

SUMMARY OF THE INVENTION

The present invention is directed to meeting the need for a dual ported memory system having the capabilities lying between the simple and complex devices noted above. In particular, the invention is directed to providing a video memory having dual ports (1) in which read and write operations may take place concurrently, (2) which may be written and read at difference clock rates, and (3) which features simplified addressing without requiring multi-bit digital input of read and write addresses.

A dual port memory system embodying the invention includes a memory array including two row conductors and two column conductors for each memory cell location, each cell having a first terminal for connection to a data input row conductor, a second terminal for connection to a data output row conductor, a third input for connection to a write address column conductor and a fourth input for connection to a read address column conductor. Input means are provided for applying data to be stored to said data input row conductors and output means are provided for recovering data stored from said data output row conductors. Cells are addressed by a first triggerable sequential pulse generator having a trigger input terminal and a plurality of output terminals coupled to said write address column conductors and being responsive to a write trigger pulse applied to said trigger input terminal for sequentially applying cell address signals to said write column conductors at a first predetermined rate. A second triggerable sequential pulse generator is provided for read addressing having a trigger input terminal and a plurality of output terminals coupled to said read address column conductors and being responsive to a read trigger pulse applied to said trigger input terminal for sequentially applying cell read address signals to said read column address conductors at a second predetermined rate. Read and write cycles are controlled by a control signal generator for generating said read and write trigger pulses in a timed relationship.

In accordance with a further feature of the invention the relative values of the predetermined rates may be selected to subject the recovered data to time compression, time expansion or a fixed time delay.

BRIEF DESCRIPTION OF THE DRAWING

The foregoing and further features of the invention are illustrated in the accompanying drawing wherein like elements are denoted by like reference designators and in which.

DETAILED DESCRIPTION

Figure 1:
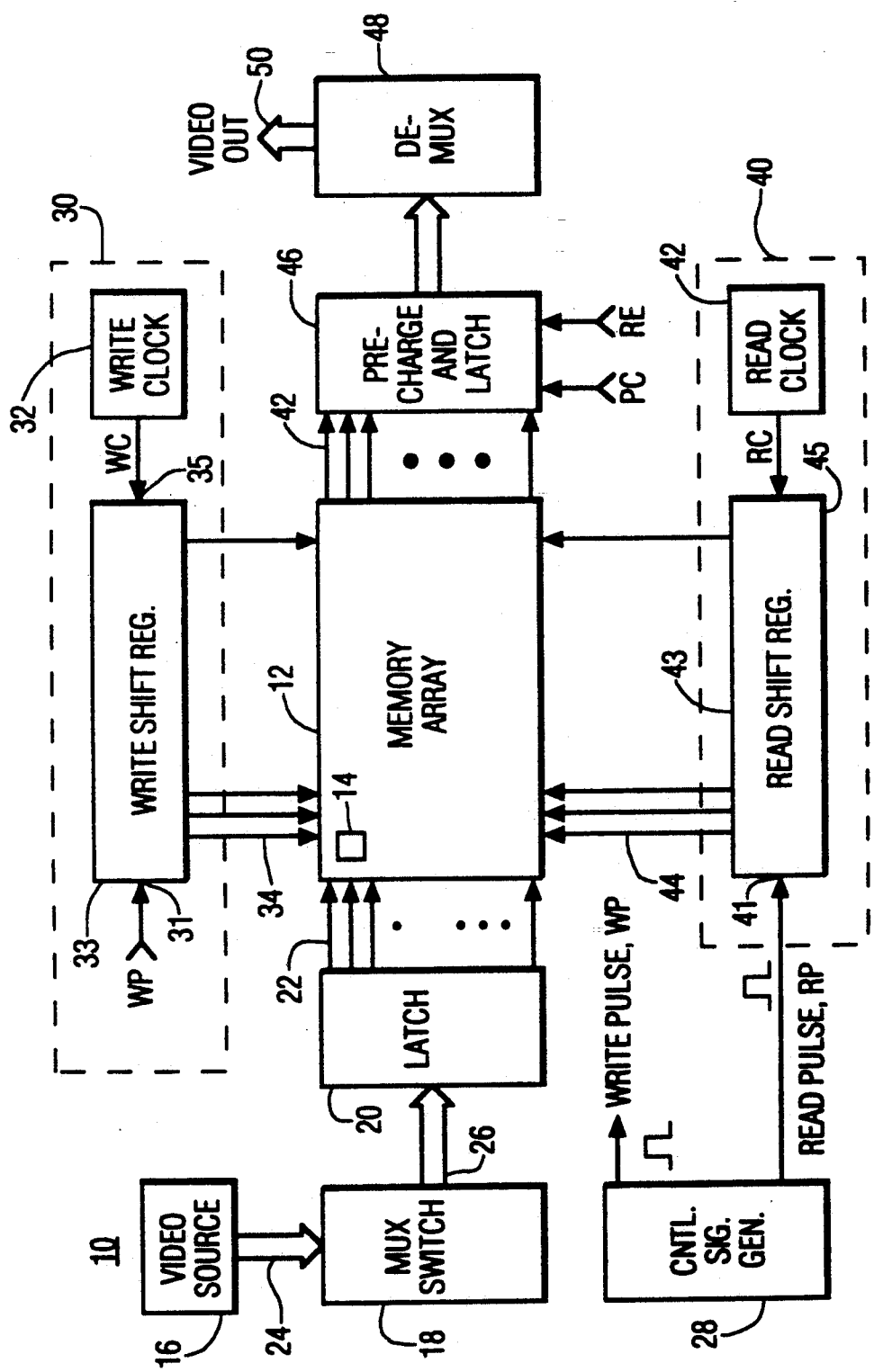
FIG. 1 is a block diagram of a dual port video memory system embodying the invention.

The memory system 10 of FIG. 1 is particularly useful in applications which do not require "bit mapped" pixel (picture element) addressing but in which concurrent read and write operations may be desired without limitations on the read/write clock rates and in which simplified addressing would be of advantage. Illustratively, the disclosed memory system may be used as a simple 1-H(one horizontal line) delay line in applications such as comb filter separation of luminance and chrominance signals or in vertical line interpolation. This mode is achieved, as will be explained, by simply tying the memory read and write clock lines together to a common clock signal source. In other applications, such as for providing video time compression, one need only supply a read clock having a frequency higher than the write clock. Such is the case in progressive scan systems in which memories are typically read at twice the write clock rate to provide 2:1 time compression. Another application would be to provide video time base correction by using variable read and/or write clock rates.

As an over-view of the disclosed memory system, in all of the exemplary applications noted above, memory addressing is simplified by employing a special form of dynamic memory cell 14 in the memory array 12 having a storage node that is effectively isolated from read and write column conductors so as to allow independent read and write operations and by the use of separate read and write sequential pulse generators which generate cell addresses sequentially at predetermined respective rates upon receiving respective read and write "start" or "trigger" pulses. Because of the cell node isolation, there can be no "bus contention" problems between the read and write column conductors. Also, the read and write row conductors are connected to different ports of the cell. In combination, the result is a memory system, as previously noted, in which read and write operations may take place concurrently, which may be written and read at different clock rates (for compression, noncompression or video expansion) and which avoids complex individual ("bit mapped") cell addressing.

In more detail, data for storage in cells 14 of the memory array 12 are provided by a video source 16 coupled via a multiplex (MUX) switch 18 to a latch 20 having outputs coupled to a plurality of row data conductors 22. Illustratively, the video source 16 may be an analog-to-digital converter or another suitable source of digital video data. For purposes of explanation, it will be assumed that the data comprises eight bit bytes on bus 24. The multiplex switch selectively applies the 8-bit data bytes to the inputs of a plurality of latches in latch circuit 20 via bus 26. Illustratively, it will be assumed that latch 20 has 64 storage locations thereby storing eight bytes of each 8-bit video data sample and presenting the resulting 64 bits of data to the write row conductors 22. Timing signals for converter 16, switch 18 and latch 20 are provided by a control signal generator 28 which also provides timing and control signals for other elements of the memory system. For clarity of illustration and to simplify the drawing, the conductors which carry the timing signals are not shown. Typically, the sampling clock for source 16 may be three or four times the video color sub-carrier frequency or some multiple of the horizontal line rate sufficient to satisfy the Nyquist criteria for the particular video signal supplied by source 16.

During a write operation, the control signal generator 28 produces a "trigger" or "write" pulse WP to start a write cycle of the memory system 10. The write pulse WP is applied to the "data" input 31 terminal of the first stage of a shift register 33 that is clocked by write clock pulses WC supplied to the clock input 35 of the shift register by a write clock generator 32. The combination of register 33 and clock 32 forms a triggerable sequential pulse generator 30 (outlined in phantom) which, once triggered by pulse WP, sequentially addresses all of the write columns of the array 12 at a rate determined by clock 32.

Figure 2:
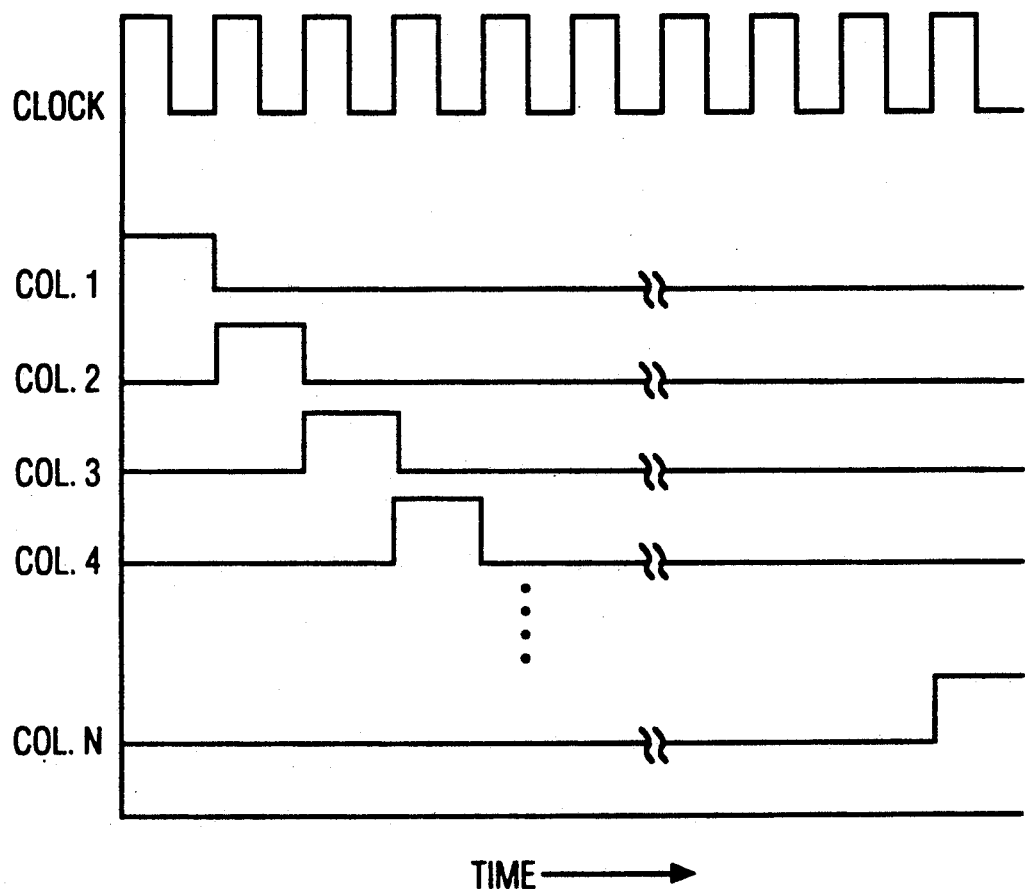
FIG. 2 is a timing diagram illustrating operation of the system of FIG. 1.

In more detail, as the write pulse WP propagates through shift register 33 in response to the "shift" or write clock pulses WC, the shift register 33 sequentially energizes the write column conductors 34 of memory array 12 thereby storing the write data provided by latch 20 in the cells 14 of memory array 12. This sequential addressing of the write column conductors is illustrated in FIG. 2 and, as shown, continues until the write pulse has propagated through all stages of the shift register and thus has sequentially addressed all the write columns of the memory array 12.

To summarize to this point, when latch 20 is filled with 64 bits of data to be stored, the write pulse WP is applied to shift register 33. Upon the first write clock WC, the pulse WP is clocked into the first stage of the shift register thereby energizing the first write column conductor (Col. 1 in FIG. 2) whereby all 64 bits are stored in the first column of array 12. Upon receipt of the next clock pulse WC, the pulse previously in the first stage of the shift register advances to the next stage and so the next write column conductor (Col.2 in FIG. 2) is energized (driven high) and the next 64 bits of write data are stored in the cells of column 2 of the array. This continues sequentially until all cells of the array contain stored data.

Advantageously, from the foregoing, it is seen that the write operation requires only a write or "trigger" pulse to initiate the sequential addressing of the write column conductors 34 and no specific binary address data is required.

Although it is preferred, for reasons of simplicity, that the triggerable sequential pulse generator 30 be implemented as shown by the combination of a shift register and a clock source, other forms of sequential pulse generator 30 are possible. For example, one may use the "trigger" or write clock pulse WC for enabling a counter having decoded outputs coupled to the column conductors and in which the last column conductor is coupled via a feedback path to thereby disable and reset the counter when all of the write column conductors have been addressed.

A memory read operation is very similar to a memory write operation but requires an additional operation of pre-charging the memory row read conductors 42. During a read operation, the pulse generator 28 supplies a read pulse RP to the input of a read shift register 43 that is clocked by read clock pulses RC from a read clock generator 42. The combination of register 43 and clock 42 forms a second triggerable sequential pulse generator 40 (outlined in phantom) which, once triggered by pulse RP, sequentially addresses all of the read columns 44 of the array 12 at a rate determined by clock 42 thereby recovering the stored data in cells 14 for each column in memory array 12.

FIG. 2, as previously discussed with regard to sequential write column addressing also illustrates sequential read column addressing. For a read operation, the clock waveform represents the read clock and the other waveforms represent the read column waveform. Upon the first clock pulse RC, the pulse RP is clocked into the first stage of the shift register 43 thereby energizing the first read column conductor (Col.1 in FIG. 2) whereby all 64 bits stored in the first column of array 12 are recovered and applied to the read conductors 42 which, in turn, are coupled to a precharge and latch circuit 46. The pre-charge and latch circuit 46 pre-charges the data read rows 42 and then latches the recovered data. Outputs of the pre-charge and latch circuit 46 are applied to a de-multiplexer switch 48 which then sequentially outputs the 64 bits read from each column in groups of eight 8-bit bytes at output bus 50.

Figure 4:
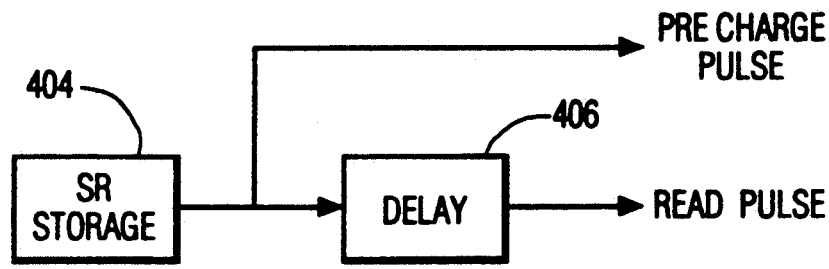
FIG. 4 is a block diagram of apparatus for providing pre-charge and read pulse timing pulses in a timed relationship for the system of FIG. 1.

The above-described read operation differs from the write operation in that the energization of the memory real row conductors 42 is preceded by a "pre-charge pulse". This may not be necessary if the memory cells 14 are of the static type. Howver, in the illustrated embodiment the cells 14 (described later) are of the dynamic type and employ precharging of the read row conductors 42 prior to reading. The pre-charge pulse may be generated, as shown in FIG. 4 as an example, by delaying the output of a read shift register stage 404 by a delay circuit 406 that imparts a delay of one read clock cycle to the read shift register output signal. The immediate signal proavided by this circuit may be used as the precharge signal PC and the delayed signal may be used for addressing a read column conductor and as a read enable signal RE for the precharge and latch circuit 46 (described later).

Further with regard to the general operation of the memory system of FIG. 1, the maximum amount of delay through the memory array 12 will be obtained by applying a read pulse RP to the input of the read shift register 43 just before applying a write pulse WP to the input of the write shift register 33. By this means, the oldest data in the array will be read just prior to being replaced by new data. A different amount of delay may be imparted to the video signal by changing the relative timing of the read pulse RP and the write pulse WP. Maximum utilization of the memory array storage capacity, however, is obtained by writing immediately after reading.

Advantageously, changing the read and write clock frequencies can provide either compression or expansion of video signals. For example, by choosing a read clock frequency higher than the write clock frequency, the video signal will be compressed by the clock frequency ratio. One may expand a video signal by choosing a read clock frequency lower than the write clock frequency. A constant delay may be achieved by making the read and write clock frequencies equal to each other. Thus, for the constant delay case a common clock signal source may be used for the separate sources shown.

Figure 3:
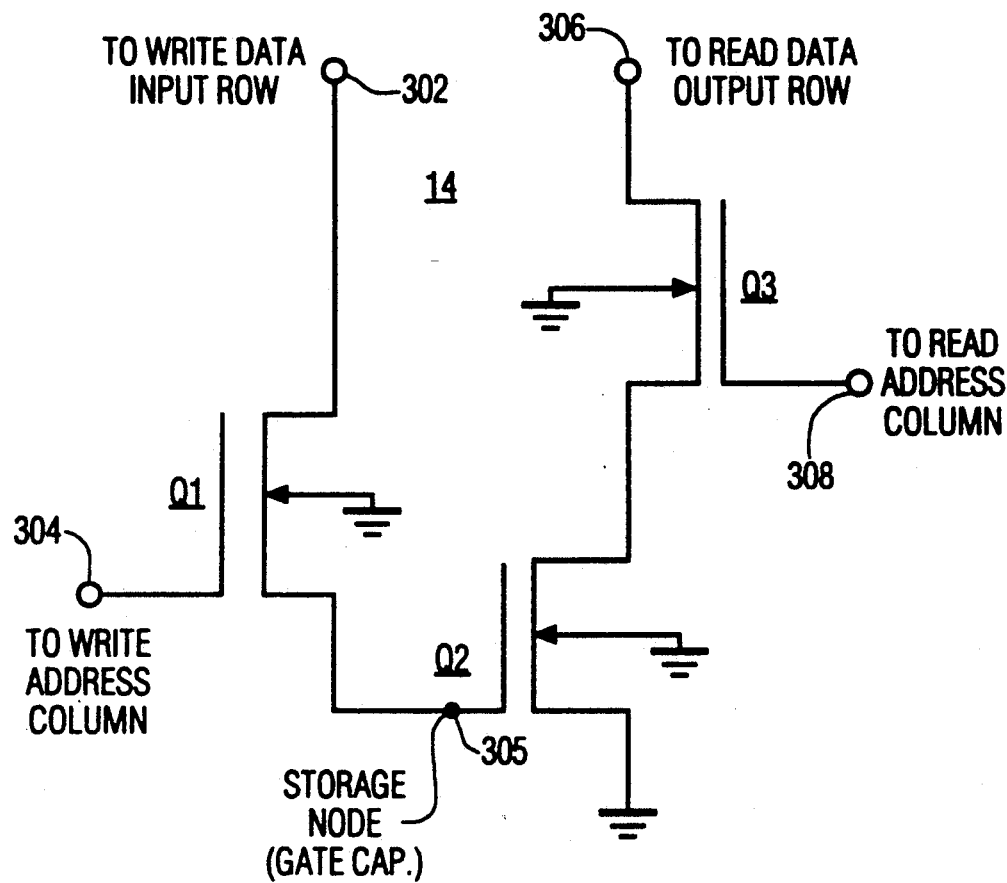
FIG. 3 is a circuit diagram of a memory cell suitable for use in the system of FIG. 1.

FIG. 3 is a circuit diagram of a memory cell 14 having separate read and write column (address) inputs and separate read and write row (data) inputs which is suitable for use in the memory array 12. This cell includes three N-channel MOS transistors Q1, Q2 and Q3. Transistor Q1 is connected at the drain thereof at terminal 302 to the write data row conductor (22) for the cell and is connected at the gate thereof (via terminal 304) to the write address column conductor (34) for the cell. The source of Q1 is connected to the gate of N-channel transistor Q2 having a gate capacitance 305 that serves as the storage node for the cell. The source of transistor Q2 is grounded and the drain thereof is coupled in series with a third N-channel transistor Q3 to terminal 306 for connection to the read data row conductor (42) for the cell. The gate of transistor Q3 is connected to a terminal 308 for connection to the read address column conductor (44) for the cell.

In operation, the gate capacitance of N-channel transistor Q2 forms a storage node 305. A positive voltage on the write address column connected to terminal 304 will prime transistor Q1 to charge the storage node 305 if the write data input row conductor connected to terminal 302 is "high" (i.e., positive) and will discharge the storage node 305 if the write data input row to which terminal 302 is low (i.e., ground or negative). The condition of the storage node 305 (i.e., high or low) is sensed by grounded source N-channel transistor Q2 having its drain connected by the conduction path of N-channel transistor Q3 to terminal 306 for connection to the read data row conductor of the cell. The gate of transistor Q3 is connected to terminal 308 for connection to the read address column conductor of the cell. When a positive voltage is applied to the read address column conductor, transistor Q3 will be turned on. Recall that the read row conductor has been previously pre-charged. Accordingly, if the voltage at node 305 is positive, both of transistors Q2 and Q3 will be turned on and therefore the read row conductor for the cell will be discharged. Conversely, if the voltage stored at node 305 is zero, the transistor Q2 will be off and so the pre-charge on the row conductor will not be discharged through the Q3-Q2 path during the read operation.

The foregoing cell structure allows concurrent read/write operations without a problem with read/write bus contention. In this regard, the memory cell 14 can be written and read at the same time because the storage node 305 is effectively isolated from the read line. For example, assume that the write address column is high. In this condition the cell storage node 305 will be either charged or discharged depending on the write data at terminal 302 when the write address transistor Q1 is turned on. There is no other charge/discharge path for the storage node 305. Accordingly, one may turn on transistor Q3 to read the cell status regardless of whether or not a write operation is in progress.

Figure 5:
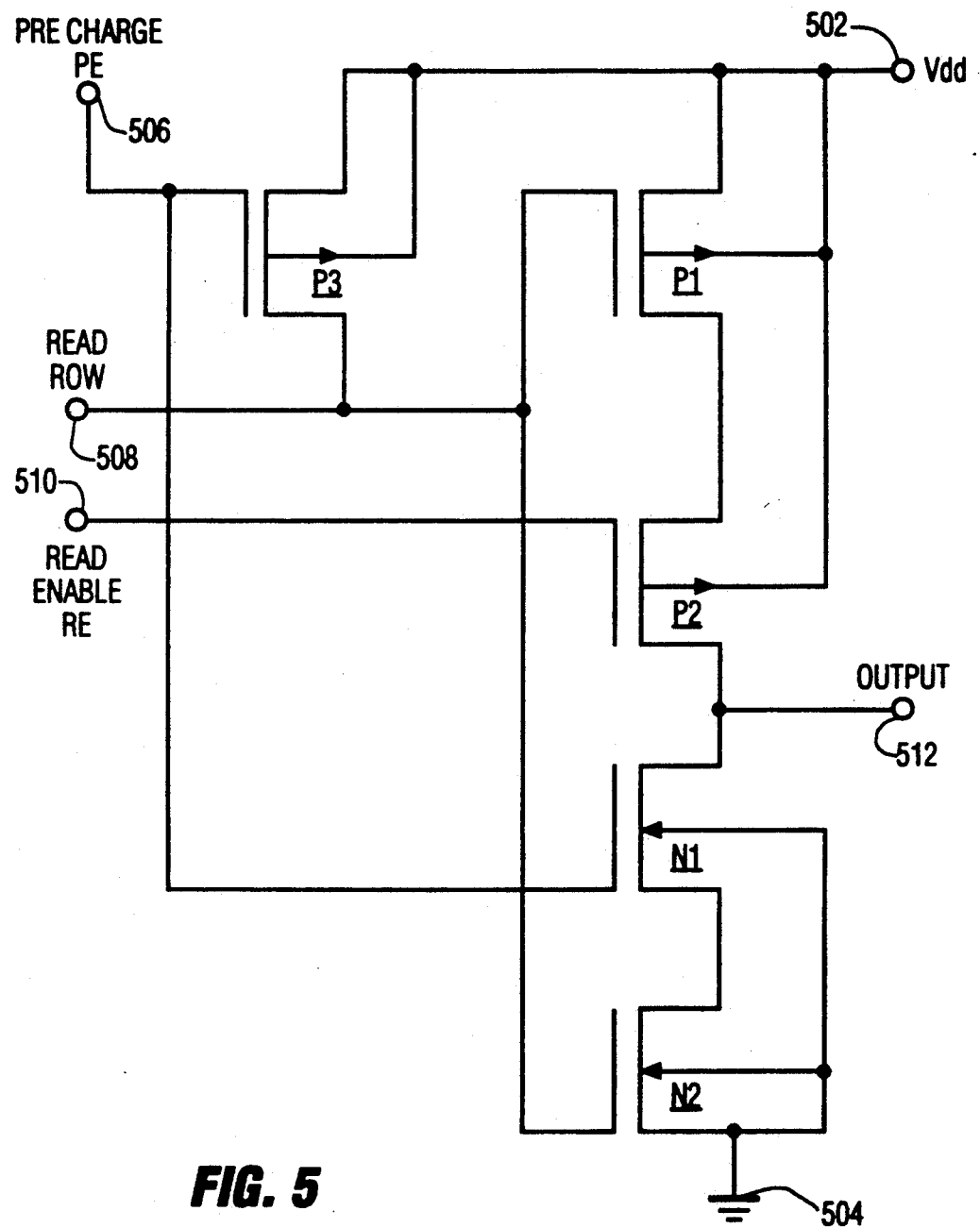
FIG. 5 is a circuit diagram of a pre-charge and latch circuit suitable for use in the memory system of FIG. 1.

FIG. 5 is a detailed circuit diagram of a pre-charge and latch circuit suitable for use as circuit 46 in the memory system of FIG. 1. One such circuit is provided for each read row conductor. The conduction paths of p-channel transistors P1 and P2 and n-channel transistors N1 and N2 are coupled in series, in the order named between a supply terminal 502 (to which a positive supply voltage Vdd is applied) and a ground terminal 404. The connection of the drain of transistor N1 and the drain of transistor P2 are connected to an output terminal 512. The gates of transistors P1 and N2 are connected to the cell read row conductor via terminal 508 and are also coupled via the conduction path of a pre-charge p-channel transistor P3 to the supply terminal 502. The gates of transistors P3 and N1 are coupled to an input terminal 506 for receiving the pre-charge pulse PE. The gate of transistor P2 is coupled to an input terminal 510 for receiving the read enable pulse RE.

In operation, a positive supply voltage Vdd is applied to the supply terminal 502. A read cycle begins, as previously explained, by pre-charging the read row conductor. This is done by applying a ground level pre-charge pulse to terminal 506. This turns the pre-charge transistor P3 ON thereby charging the read row conductor (42) connected to terminal 508 to be charged to the voltage Vdd. Concurrently, transistor N1 is turned OFF and transistor P1 also is turned OFF so no current can flow in the P1 to N4 conduction path. When the pre-charge pulse returns to a high (Vdd) level the transistor Q3 of the associated memory cell is turned ON. When this happens transistors Q2 and Q3 will discharge the row conductor if storage node 305 is charged, otherwise the row conductor will remain charged. At the same time as the cell is enabled (Q3 turned on), the read enable line at terminal 510 will go low thereby turning transistor P2 ON. In this condition the output terminal will receive charging current from transistors P1 and P2 if the voltage on the row conductor is low and, conversely will receive discharge current through transistors N1 and N2 if the voltage on the row conductor is high. The output charge at output 520 is stored on the gate capacitance of a subsequent MOS transistor (not shown). When the read enable signal ends (i.e., assumes a low level at the end of the read pulse) transistor P2 will be turned OFF thereby latching the voltage at the output node (terminal 520) at a value determined by the state of the row conductor prior to the read cycle.

To summarize the foregoing, the pre-charge signal PE is normally high prior to a read cycle and goes low just before the read cycle thereby pre-charging the row conductor. Immediately after pre-charging, the transistor Q3 of the associated memory cell is turned ON thereby allowing the cell to discharge or not discharge the read row conductor depending on the charge stored at the cell node 305. At the same time the read enable signal goes low thereby turning on transistor P2 whereupon the output node (terminal 510) is either charged by transistors P1 and P2 or discharged by transistors N1 and N2. When the read enable signal terminates, the charge state of the output node 510 is latched by turn-off of transistor P2. Storage of the charge at terminal 410 may be ensured by applying terminal 510 to an MOS type of buffer stage such as a CMOS inverter. A pair of CMOS inverters in series will ensure that the output data is not inverted and is preferred.

There has been shown and described a dual ported video memory in which read and write operations may take place concurrently, which may be written and read at different clock rates and which features simplified addressing without requiring multi-bit specific read or write binary addresses and associated decoders. Various changes and modifications may be made to the specific embodiment of the invention herein described within the scope of the invention as defined by the appended claims. As previously explained, for example, the triggerable sequential pulse generators 30 and/or 40 may be implemented by means other than shift registers and clocks such as the resettable counter/decoder arrangement previously explained in detail. Also, the cells of the array may be of the static (rather than dynamic) type disclosed provided they are capable of independent read/write addressing without loss of data. For video signal processing, the illustrated dynamic cells have adequate storage time without the need for any "refreshing" (i.e., data re-writing) and require only three transistors. In applications requiring processing of relatively low frequency signals (without refreshing) a static memory cell may be used to advantage provided it meets the requirements of enabling concurrent reading and writing of data as in the illustrated embodiment. In a given application one may feed back the memory output to its input on a regular basis thereby "refreshing" the memory cell voltages and thus extending the lower limit of clock frequencies to any desired value.

What is claimed is:

1. A dual port memory system, comprising:
    a memory array including two row conductors for each row of cells and two column conductors for each column of cells, each cell having a first terminal connected to a data input row conductor, a second terminal connected to data output row conductor, a third input connected to a write address column conductor and a fourth input connected to a read address column conductor;
    input means for applying data to be stored to said data input row conductors;
    output means for recovering data stored from said data output row conductors;
    a first triggerable sequential pulse generator having a trigger input terminal and a plurality of output terminals coupled to said write address column conductors and being responsive to a write trigger pulse applied to said trigger input terminal for sequentially applying cell address signals to said write address column conductors at a first predetermined rate;
    a second triggerable sequential pulse generator having a trigger input terminal and a plurality of output terminals coupled to said read address column conductors and being responsive to a read trigger pulse applied to said trigger input terminal for sequentially applying cell read address signals to said read address column conductors at a second predetermined rate; and
    a control signal generator for generating said read and write trigger pulses in a timed relationship.

2. A dual port memory system as recited in claim 1 wherein for compression of data said second predetermined rate is greater than said first predetermined rate.

3. A dual port memory system as recited in claim 1 wherein for providing constant delay of data said predetermined rates are equal.

4. A dual port memory system as recited in claim 1 wherein for providing expansion of data said second predetermined rate is less than said first predetermined rate.

* * * * *